United States Patent [19]

Madan

[11] 4,398,054

[45] Aug. 9, 1983

[54] COMPENSATED AMORPHOUS SILICON SOLAR CELL INCORPORATING AN INSULATING LAYER

[75] Inventor: Arun Madan, Moraga, Calif.

[73] Assignee: Chevron Research Company, San Francisco, Calif.

[21] Appl. No.: 367,812

[22] Filed: Apr. 12, 1982

[51] Int. Cl.³ .................. H01L 31/06; H01L 31/18
[52] U.S. Cl. .................................. 136/255; 136/258; 357/2; 357/30; 427/39; 427/74; 427/86
[58] Field of Search ........... 136/255, 258 AM; 357/2, 357/15, 30, 59; 427/39, 74, 86

[56] References Cited

U.S. PATENT DOCUMENTS 4,200,473 4/1980 Carlson .............................. 136/255
4,217,148 8/1980 Carlson .............................. 136/255

OTHER PUBLICATIONS

H. J. Pauwels et al., "Influence of an Insulating Layer on the Efficiency of a Semiconductor–Insulator–Semiconductor (SIS) Heterojunction Solar Cell", *Solid-State Electronics*, vol. 21, pp. 693–698, (1978).

*Primary Examiner*—Aaron Weisstuch
*Attorney, Agent, or Firm*—D. A. Newell; E. J. Keeling; A. Stephen Zavell

[57] ABSTRACT

A P-I-N type compensated amorphous silicon solar cell which incorporates an insulating layer adjacent to the compensated intrinsic amorphous silicon layer.

15 Claims, 1 Drawing Figure

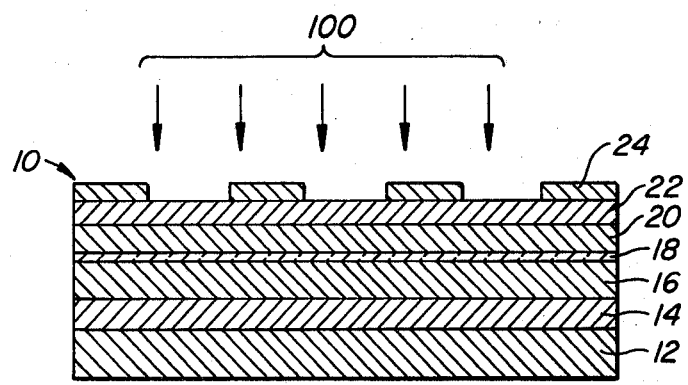
FIG._1.

COMPENSATED AMORPHOUS SILICON SOLAR CELL INCORPORATING AN INSULATING LAYER

BACKGROUND OF THE INVENTION

This invention relates to thin film solar cells. More specifically, this invention relates to thin film hydrogenated amorphous silicon solar cells.

Photovoltaic cells, such as hydrogenated amorphous silicon solar cells, are capable of converting solar radiation into usable electrical energy. The electrical energy conversion occurs as a result of what is well known in the solar cell field as the photovoltaic effect. Solar radiation impinging on a solar cell is absorbed by the semiconductor layer, which generates electrons and holes. The electrons and holes are separated by a built-in electric field, for example, a rectifying junction, such as an N-I-P junction, in the solar cell. The electrons flow toward the N-type region and the holes flow toward the P-type region. The separation of the holes and electrons across the rectifying junction results in the generation of an electric current known as the photocurrent and an electric voltage known as the photovoltage.

Photovoltaic researchers have been investigating various paths toward the generation of electricity from sunlight which can compete on an economic basis with conventional means of generating electricity. One of the main areas of focus for research is low cost, large area hydrogenated amorphous silicon solar cells. Hydrogenated amorphous silicon is a low cost semiconductor material which can be manufactured by processes such as glow discharge, sputtering, or reactive sputter deposition. These processes are adaptable to automated manufacturing techniques and large area panels. Current research focuses on improving the efficiency of the devices as the area of the cells increase. The cells can be fabricated in many known semiconductor configurations, such as P-I-N solar cells, N-I-P solar cells, Schottky barrier solar cells, and MIS solar cells (the first letter designates the incident surface through which solar radiation first penetrates the cell).

Thus far, devices incorporating a photoactive intrinsic region, such as NIP devices and the like, have exhibited the highest efficiencies. However, Schwartz teaches, in *J. Appl. Phys.* Vol. 53, 715 (1982), that a limiting factor in an NIP solar cell is the back diffusion of holes into the N-type layer which lowers the short circuit current ($J_{sc}$) of the device. In addition, the photoactive intrinsic region of the NIP device has a bandgap greater than the optimum bandgap for the maximum absorption of solar radiation. Thus, it would be highly desirable to have an NIP solar cell wherein solar radiation enters through the N-type region, which minimizes the back diffusion of holes, and has a photoactive intrinsic region more closely matched to the ideal bandgap for increased absorption of solar radiation.

SUMMARY OF THE INVENTION

I have invented an amorphous silicon solar cell which incorporates a photoactive compensated intrinsic region and an insulating layer between said intrinsic region and an incident N-type region of the hydrogenated amorphous silicon. My invention also encompasses a method of decreasing the bandgap of the photoactive intrinsic region and suppressing the diffusion of holes back into the N-type region from the photoactive intrinsic region.

BRIEF DESCRIPTION OF THE DRAWING

FIG. 1 illustrates an N-I-P hydrogenated amorphous silicon solar cell incorporating a photoactive compensated intrinsic region and an insulating layer between the N-type layer of hydrogenated amorphous silicon and the photoactive intrinsic layer.

DETAILED DESCRIPTION OF THE INVENTION

The invention will be more clearly illustrated by referring to FIG. 1 which depicts an N-I-P solar cell designated as 10. Solar radiation 100, impinging on solar cell 10, forms a reference point for the incident surface of each layer or region of the solar cell. The solar cell 10 includes an electrically conductive substrate 12 of stainless steel, molybdenum, titanium, or other suitable materials. Optionally, a thin layer of aluminum, chromium, or other highly reflecting metal can be deposited on the base metal substrate layer 12 to reflect solar radiation back into the photoactive layer 16. Optionally, substrate 12 may be a transparent material such as glass or sapphire, coated with an electrically conductive material such as a transparent conductive oxide, hereinafter referred to as TCO, such as tin oxide, indium tin oxide, or like material. If the substrate 12 is a material coated with a TCO layer, then solar radiation can enter from either side.

A first layer 14 of P-type hydrogenated amorphous silicon is deposited upon the substrate 12. Preferably, the layer 14 is graded from P+-type conductivity ohmically contacting the substrate 12 to P-type conductivity contacting layer 16. The hydrogenated amorphous silicon can be fabricated by glow discharge, sputtering, or reactive sputtering. Glow discharge is the preferred method of fabrication. The layer 14 is doped to a P-type conductivity with P-type conductivity modifiers such as boron, aluminum, gallium, indium, or other suitable P-type dopants. The layer 14 has a bandgap which is typically on the order of about 1.2–1.4 eV and a thickness of from about 20 to about 50 nanometers and preferably about 30 nanometers. The layer 14 incorporates P-type conductivity modifiers in an amount of from about 20 to about 40,000 volume ppm and preferably about 30,000 ppm. Alternatively, the P-type layer can be a wide bandgap amorphous silicon, i.e. greater than 1.8 eV, if the amorphous silicon is fabricated in an atmosphere which includes $NH_3$, $N_2O$, or $CH_4$.

A layer 16 of photoactive compensated intrinsic amorphous silicon is deposited upon layer 14. The photoactive compensated intrinsic layer is from about 250 to about 400 nanometers thick and preferably about 350 nanometers thick. The layer 16 has a bandgap of from about 1.4 to about 1.6 eV and preferably about 1.5 eV. The photoactive layer 16 would have a bandgap in excess of about 1.7 eV if it were not compensated. The increased absorption of the compensated region permits the thickness of the layer to be reduced. An uncompensated layer is typically on the order of 400–1000 nanometers thick. N-type and P-type dopants are incorporated into the layer 16 in a concentration of from about 500 to about 1500 volume ppm. The concentrations of the dopants are adjusted to decrease the bandgap of the photoactive intrinsic region and thus increasing the absorption. Since the incorporation of the dopants tends to increase the defect state density, the concentration of the dopants should be adjusted so that the recombination lifetime of photogenerated electrons and holes is greater than the transit time for the holes and electrons to migrate toward the N-type and P-type regions, respectively.

The P-type dopants are added to reduce the optical bandgap to the desired bandgap energy, preferably about 1.5 eV. However, the P-type dopants lower the Fermi level of the material below that of uncompensated photoactive intrinsic hydrogenated amorphous silicon. Therefore, sufficient N-type dopants are also added to bring the Fermi level of the intrinsic hydrogenated silicon back up to the level of uncompensated hydrogenated amorphous silicon. Preferably, the level of N-type dopants is adjusted so that the final solar cell has a Fermi level that moves through the lowest possible density of states such as to give the widest possible depletion width for the compensated intrinsic material contacting either a Schottky barrier metal or a different doped semiconductor material such as P-type a-Si:H or P-type a-Si:F:H and the like. The N-type dopants are added to maximize the photoluminescense of the hydrogenated amorphous silicon coupled with a conductivity activation energy of about 0.6 eV to about 0.8 eV and preferably about 0.7 eV.

Between the photoactive intrinsic layer 16 and the N-type layer 20 of the solar cell is a thin insulating layer 18. The insulating layer has a thickness of from about 1 to 5 nanometers and preferably about 3 nanometers. Suitable insulators are silicon nitride $Si_3N_4$, $SiO_2$, BN, $Ta_2O_5$, $Nb_2O_5$, and the like. $Si_3N_4$ and $SiO_2$ are preferred because they can be fabricated in a glow discharge atmosphere with silane and ammonia or silane and nitrous oxide, ($N_2O$), respectively. The incorporation of the insulating layer 18 between photoactive intrinsic compensated layer 16 and the N-type layer 20 serves to reflect holes back into the photoactive compensated intrinsic layer 16. The reflection of the holes prevents them from combining with electrons in the N-type layer 20 which would thus reduce the $J_{sc}$ of the solar cell 10.

The insulator layer 18 is selected and/or adjusted so that the electron affinity of the insulator is the same as the semiconductor material and there is no impediment to the electric current flow. However, this insulator layer presents a barrier to the back diffusion of holes because of the wider bandgap energy of the insulator in comparison to the bandgap energy of the semiconductor. This suppression of the back diffusion of holes increases the quantum efficiency of the solar cell in the blue region of the solar spectrum. The thickness of the insulator layer is adjusted to maximize the quantum efficiency at the blue end of the AM 1 excitation spectrum. Beyond this thickness, the overall quantum efficiency of the solar cell is decreased because the solar cell operates in tunnel dominated regime rather than a semiconductor dominated regime.

A layer 20 of N-type hydrogenated amorphous silicon is fabricated on top of the insulating layer 18. Preferably, layer 20 is graded from N-type conductivity at the layer 18 interface to $N^+$-type conductivity at the layer 22 interface. The $N^+$-type conductivity assures an ohmic contact to layer 22. The layer 20 incorporates suitable N-type dopants such as phosphorus, arsenic, nitrogen, antimony and the like. Phosphorus is a preferred dopant because it can be incorporated during the glow discharge fabrication of the layer through the use of phosphine gas, $PH_3$. The layer 20 has a thickness of from about 10 to about 40 nanometers and preferably about 20 to about 30 nanometers with an N-type dopant concentration of about 10,000 volume ppm and a bandgap of about 1.8 eV.

A transparent conductive electrode, TCE electrode, layer 22 is fabricated on the layer 20. The TCE layer can optionally be fabricated in a quarter wavelength thickness to possess antireflection properties and increase the overall efficiency of the solar cell. A suitable TCE layer can be a transparent conductive oxide (TCO) such as indium tin oxide. The TCO layer 22 can have a thickness of from about 50 to about 150 nanometers and preferably about 70 nanometers. The TCO layer should have a sheet resistivity of less than about 60 ohms/square, preferably less than about 30 ohms/square and most preferably less than about 20 ohms/square. Optionally, layer 22 can be a thin transparent metal such as gold, platinum and the like.

As the size of the solar cell 10 increases, a grid electrode 24 must be fabricated on the TCO electrode 22 to withdraw the current from the solar cell generated during illumination by solar radiation illustrated as 100.

Optionally, the cell can be fabricated in a back wall construction wherein the major supporting substrate is a transparent material such as glass or sapphire and the TCO contacts the transparent substrate. In this embodiment, the back electrode 12 can be a thick film cermet as taught in U.S. Pat. No. 4,162,505, incorporated herein by reference.

The device can be fabricated by methods known in the art such as U.S. Pat. Nos. 4,064,521; 4,217,148; and 4,226,898, said patents incorporated herein by reference. Suitable glow discharge apparatus are commercially available such as a Model 2306 of Plasma Systems, Inc., a subsidiary of Plasma-Therm, Inc., Woburn, Mass., a Model PWS 450 Coyote, a product of Pacific Western Systems, Inc., Mountain View, Calif., or a Model PND-301-MQ(6), a product of LFE Corp., Waltham, Mass.

For example, P-type or $P^+$-type hydrogenated amorphous silicon can be fabricated from $SiH_4+B_2H_6$, $SiH_4+H_2+B_2H_6$, $SiF_4+H_2+B_2H_6$, $SiCl_2H_2+H_2+B_2H_6$, the halogenated silicon gases plus hydrogen and a P-type dopant, and the like. Wide bandgap P-type material can be fabricated from $SiH_4+CH_4+B_2H_6$, $SiH_4+N_2O+B_2H_6$, $SiH_4+NH_3+B_2H_6$, the halogenated silicon gases and $CH_4$ or $NH_3$, and the like. The compensated intrinsic amorphous silicon can be fabricated from $SiH_4+B_2H_6+PH_3$, $SiF_4+H_2+B_2H_6+PH_3$, $SiH_4+H_2+B_2H_6+PH_3$, other halogenated silicon gases, hydrogen, diborane, phosphine, and the like. N-type or $N^+$-type material can be fabricated from the same materials as the P-type material, however, $PH_3$, $AsH_3$ or other suitable N-type dopant is substituted for the P-type dopant. Suitable substrate temperatures are from about 250°–350° C. with a power density of 0.2–2w/cm$^2$, a flow rate of 5–50 SCCM, and a deposition pressure of 0.1–2 Torr.

More specifically, a substrate is placed in a glow discharge apparatus and the pressure in the apparatus is reduced to about $10^{-6}$ Torr. Thereafter, the temperature of the substrate is raised to about 280° C. and silane at a flow rate of about 20 SCCM containing from about 1 to 5% $B_2H_6$ is entered into the glow discharge apparatus and the background pressure is maintained at about 0.5 Torr. The glow discharge electrodes are energized and the flow rate of silane containing P-type dopant is continued until a P-type layer of about 20-nanometer thickness is fabricated. Thereafter, the P-type doping concentration is reduced to about 500 vol. ppm - 1500 vol. ppm and an N-type doping source is turned on to grow about a 350-nanometer compensated photoactive intrinsic region containing from about 500 to about 1500 volume ppm N-type and P-type dopants. At the completion of the growth of the photoactive layer, the N-type and P-type dopants are terminated, ammonia is admitted into the glow discharge chamber in an amount such that the atmosphere is about 70% silane, 30% ammonia. The flow rate of the gases is about 20 SCCM. The flow rate is continued until a thin insulating layer of about 3 nanometers is deposited on the photoactive compensated intrinsic region. At the completion of the growth of the insulating layer, the ammonia flow is terminated and silane with about 1% N-type dopant of phosphine is admitted to grow a 20 to 30 nanometers thick layer of N-type conductivity amorphous silicon. During the growth of the N-type layer, the substrate temperature is reduced to about 280° C.

Thereafter, a transparent conductive oxide is fabricated on top of the $N^+$-type layer by evaporation. If necessary, the grid electrode is fabricated on the transparent conductive oxide by photolithographic techniques or electron beam evaporation through a mask and like methods. Finally, wires are attached to the top electrodes and the base substrate electrode.

Although the invention is described as an N-type/compensated intrinsic/insulating/P-type solar cell, the embodiments of the invention are equally applicable to any device which incorporates a photoactive intrinsic region and an N-type region which is incident to solar radiation such as an MIS solar cell or an N-type schottky barrier solar cell. The solar cell can also be fabricated as a solar battery as disclosed in U.S. Pat. No. 4,316,049, incorporated herein by reference. Modifications of the invention which would be obvious to the ordinary skilled artisan are contemplated to be within the scope of same.

What is claimed is:

1. A solar cell comprising:
    an electrically conductive substrate;
    a layer of P-type conductivity hydrogenated amorphous silicon electrically contacting said substrate;
    a layer of photoactive compensated intrinsic hydrogenated amorphous silicon contacting said P-type layer, said layer having a bandgap energy less than about 1.6 eV and incorporating N-type and P-type dopants in an amount sufficient to reduce the bandgap of the layer while maintaining a recombination lifetime which is greater than the transit time of holes and electrons out of said layer during the illumination of said layer by solar radiation;
    a layer of electrically insulating material contiguous to and deposited on said photoactive layer of compensated hydrogenated amorphous silicon;
    a layer of N-type conductivity hydrogenated amorphous silicon contacting said insulating layer; and
    means for electrically contacting said N-type layer.

2. The amorphous silicon solar cell according to claim 1 wherein said insulating layer has a thickness of from about 1 to 5 nanometers.

3. The amorphous silicon solar cell according to claim 2 wherein the insulator is selected from the group consisting of $Si_3N_4$, $SiO_2$, BN, $Ta_2O_5$ and $Nb_2O_5$.

4. The amorphous silicon solar cell according to claim 3 wherein said insulating layer has a thickness of about 3 nanometers.

5. The amorphous silicon solar cell according to claims 1 or 2 wherein said photoactive compensated layer incorporates N-type and P-type dopants in an amount of from about 500 to about 1500 volume ppm.

6. A solar cell according to claim 5 wherein the compensated layer has a bandgap of about 1.5 eV.

7. The solar cell according to claim 5 wherein the amorphous silicon incorporates a halogen therein.

8. A method of reflecting holes back into a photoactive compensated intrinsic hydrogenated amorphous silicon layer in an amorphous silicon solar cell, said solar cell incorporating an N-type layer incident to solar radiation, said method comprising:
    incorporating suitable N-type and P-type dopants into the photoactive compensated intrinsic layer during the fabrication thereof in an amount sufficient to reduce the bandgap of said photoactive intrinsic region, said dopants being incorporated in an amount such that the recombination lifetime of holes and electrons is greater than the transit time of said holes and electrons out of said layer during the illumination of said intrinsic layer; and
    fabricating an insulating layer between the photoactive compensated layer and a layer of N-type conductivity hydrogenated amorphous silicon incident to solar radiation.

9. The method according to claim 8 wherein the N-type and P-type dopants are incorporated in an amount sufficient to fabricate an intrinsic region containing N-type and P-type dopant concentrations on the order of 500 to about 1500 vol. ppm.

10. The method according to claim 9 wherein the substrate temperature is from about 250° C. to about 350° C. during the deposition.

11. The method according to claim 8 wherein the growth atmosphere for said amorphous silicon comprises silicon-hydrogen-halogen gases.

12. The method according to claim 11 wherein the atmosphere is $SiF_4$ and $H_2$.

13. The method according to claim 8 or 11 wherein the insulating layer is from about 1 to about 5 nanometers thick.

14. The method according to claim 13 wherein the insulator is selected from the group consisting of $Si_3N_4$, $SiO_2$, BN, $Ta_2O_5$, and $Nb_2O_5$.

15. The method according to claim 14 wherein the compensated layer has a bandgap energy less than about 1.6 eV.

* * * * *